United States Patent
Ehlermann

Patent Number: 5,691,651
Date of Patent: Nov. 25, 1997

[54] DEVICE FOR TESTING INTEGRATED CIRCUITS

[76] Inventor: Eckhard Ehlermann, Hohenzollernstrasse 81, 8000 Munich 40, Germany

[21] Appl. No.: 410,598

[22] Filed: Mar. 27, 1995

Related U.S. Application Data

[63] Continuation of Ser. No. 822,761, Jan. 21, 1992, abandoned.

[30] Foreign Application Priority Data

Jan. 23, 1991 [DE] Germany .......... 41 01 920.2

[51] Int. Cl.⁶ .................. G01R 1/073
[52] U.S. Cl. .................. 324/760; 324/762
[58] Field of Search .................. 324/760, 754, 324/761, 762

[56] References Cited

U.S. PATENT DOCUMENTS

| | | | |
|---|---|---|---|
| 3,551,807 | 12/1970 | Kulischenko et al. | 324/72.5 |
| 3,963,985 | 6/1976 | Geldermans | 324/158 F |
| 4,567,432 | 1/1986 | Buol et al. | 324/158 P |
| 4,599,559 | 7/1986 | Evans | 324/158 P |
| 4,836,797 | 6/1989 | Riechelmann | 324/158 F |
| 4,924,589 | 5/1990 | Leedy | 324/158 P |
| 4,939,454 | 7/1990 | Miner | 324/754 |
| 4,968,931 | 11/1990 | Littlebury et al. | 324/158 P |
| 4,975,637 | 12/1990 | Frankeny et al. | 324/158 F |
| 4,980,636 | 12/1990 | Romanofsky et al. | 324/158 F |
| 5,034,688 | 7/1991 | Moulene et al. | 324/158 P |
| 5,177,439 | 1/1993 | Liu et al. | 324/754 |
| 5,210,485 | 5/1993 | Kreiger et al. | 324/758 |
| 5,219,765 | 6/1993 | Yoshida et al. | 324/754 |

FOREIGN PATENT DOCUMENTS

| | | | |
|---|---|---|---|
| 0131375 | 1/1985 | European Pat. Off. | |
| 0244750 | 10/1988 | Japan | 324/158 P |

OTHER PUBLICATIONS

Patent Abstracts Of Japan, vol. 8, No.1 (P–246)(1438) 6 Jan. 1984: JP-A-58-165056.

Primary Examiner—Ernest F. Karlsen
Attorney, Agent, or Firm—Handal & Morofsky

[57] ABSTRACT

Device for testing integrated circuits by establishing a connection between the instrument and the circuit's pads, with a test card (1) that has pads or pins (4) on top of the instrument and conductively connected with a large number of contact needles (5) that can be contacted with the pads, whereby the contact needles (5) are secured in a holder (2) that is connected to the card by a fastener that allows at least part of the card (1) to move in relation to the needle holder (2), with the result that the needle holder (2) is extensively mechanically separated from the card (1).

24 Claims, 3 Drawing Sheets

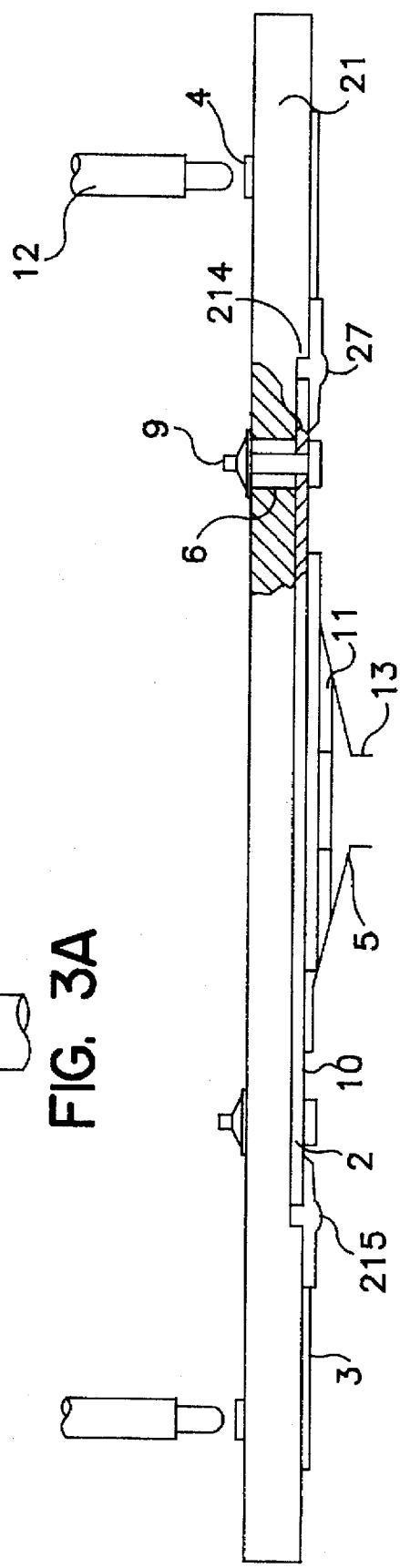

DEVICE FOR TESTING INTEGRATED CIRCUITS

This application is a continuation of application Ser. No. 07/822,761, filed Jan. 21, 1992, now abandoned.

BACKGROUND OF THE INVENTION

The invention concerns a device for testing integrated circuits.

A large number of contact needles mounted on a disk-shaped test card in devices of this type are contacted with the circuit's pads. Electric contact between the needles and the testing instrument is established by way of the printed circuits and connectors on the card. Once the integrated circuit has accordingly been connected to the instrument, its functions subject to such various climatic conditions as ancient temperature and humidity, for example, can be tested.

A testing device is known from U.S. Pat. No. 4,599,559. An annular disk of electrically non-conductive material is mounted on the instrument and connected to it by way of leads mounted on the disk. Around the inside circumference of the disk is a ceramic ring with the needles mounted on it. The needles are connected to circuits printed on the disk and terminating in leads that attach to the instrument's circuitry.

This device is associated with problems due to temperature-dictated deformation of the disk. If an integrated circuit is to be tested at temperatures ranging from −40° to +100° C., for example, the disk will deform. Although the central ceramic ring will impede expansion, the disk will warp on the instrument, and the ring's position cannot be maintained.

To prevent damage to the integrated circuit's pads, the needles can rest against them with only slight pressure, so that some needles will be lifted off their pads even when the ring is at just a slight angle to the plane of the pads.

Displacement of a needle in relation to a pad due to deformations in the test card can also damage the pads.

Tests covering a wide range of temperatures are accordingly often carried out with different cards, each ensuring the requisite needle geometry at a particular temperature. This is complicated, however.

SUMMARY OF THE INVENTION

The object of the present invention is a testing device wherein the contact needles will retain their geometry in relation to one another and to the plane of the pads in the integrated circuit over a wide range of applications, of temperatures, for example.

This object is attained with a design wherein the needle holder, the part of the test card that the needles are secured in, is extensively mechanically separated from the rest of the card, so that at least some of the card can move in relation to the needle holder without essentially affecting the positioning of the needle holder and hence of the needles.

The needle holder in this embodiment is accordingly fastened to the test card at only one point. At its other points of attachment, the needle holder is attached such that it can be displaced within the plane of the card, which is generally horizontal, only perpendicular thereto and accordingly vertically. The fastening accordingly dictates the position of the needle holder.

Temperature-dictated expansion of the test card is not impeded by the displaceable attachment, and the card will not warp.

Such an attachment of the needle holder, allowing the desired relative motion, can be embodied in many ways. The needle holder can, for example, be secured at a single point with a positive fastener and slide horizontally as if along a track at other points or secured with a layer of elastic adhesive.

It is also possible to secure all of the needle holder to a suspension secured to the instrument completely independent of the test card and subject to no changes in shape or size.

It is of advantage to fasten the needle holder to the test card in the vicinity of where the card in mounted on the instrument.

Since integrated circuits usually have a semi-conductive substrate, they have an exceptionally low coefficient of heat expansion. The needle holder should accordingly also consist of a material that has only a low heat-expansion coefficient, ceramic or materials like aluminum oxide, for example, whereby sandwiches are also appropriate. The needle holder can also be in several parts. The climatic behavior of the needle holder should generally match that of the circuit being tested within the test range.

The needle holder can also be replaceable, in which case the device will be easy to adapt to circuits with different climatic behaviors.

BRIEF DESCRIPTION OF THE DRAWINGS

FIGS. 1 and 1A are bottom views of one embodiment of the testing device;

FIGS. 3 and 3A are bottom views of another embodiment of the testing device.

DETAILED DESCRIPTION OF THE INVENTION

Figure 1:
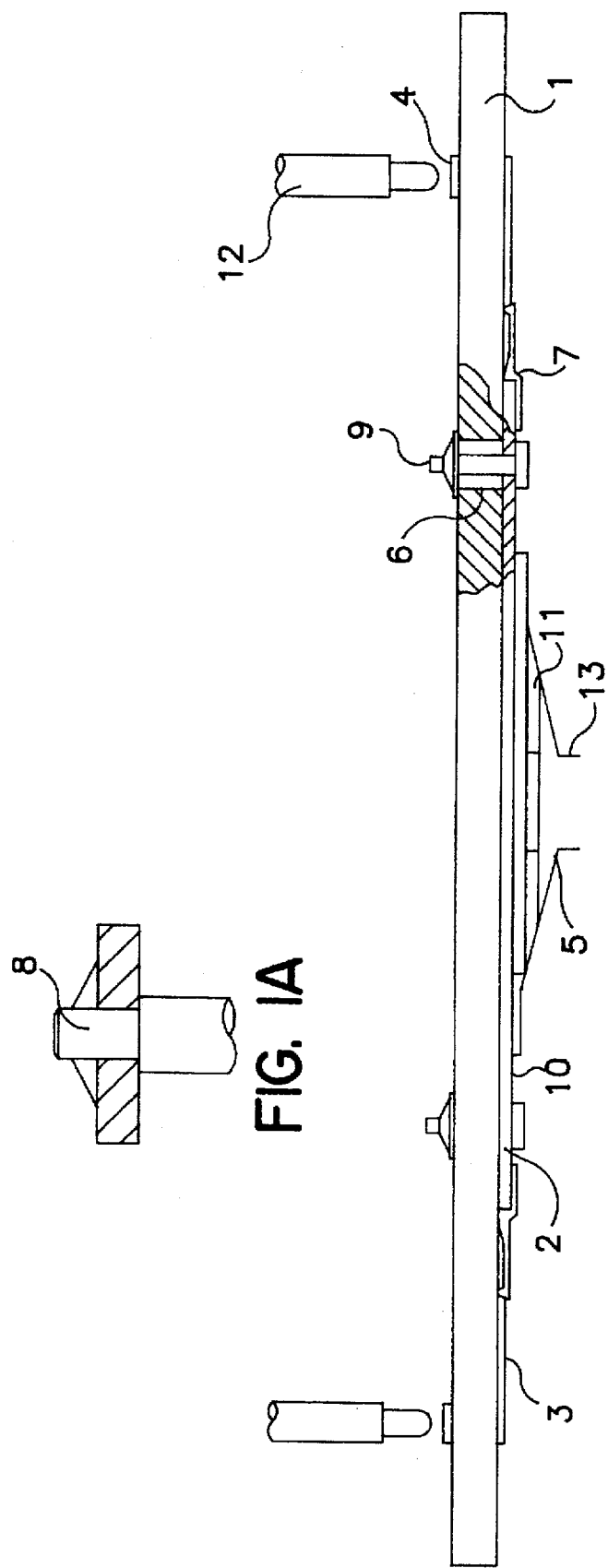
Figure 2:
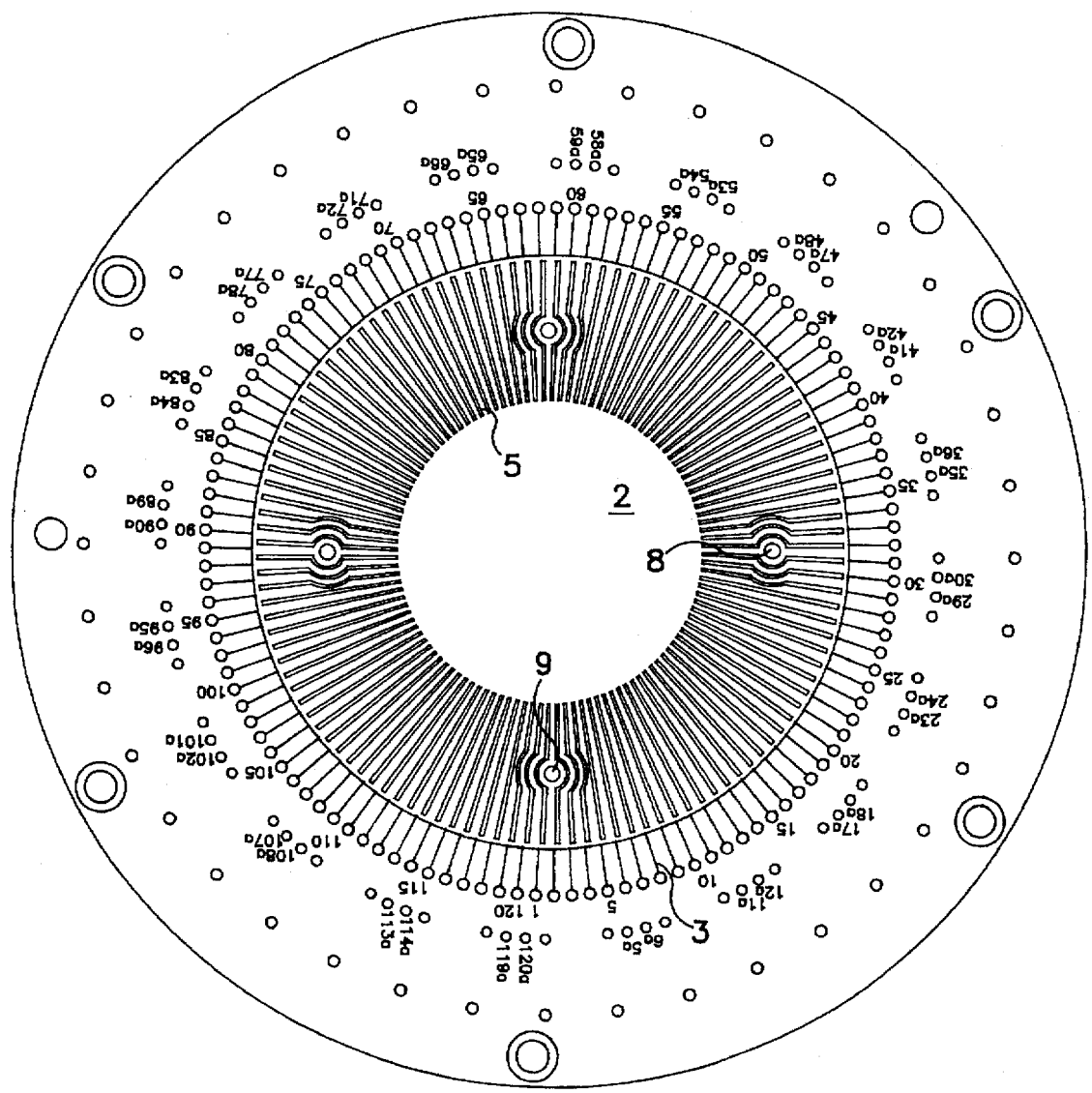
FIG. 2 is a section through the testing device.

The bottom of a test card 1 has printed circuits 3 terminating on the top in pads or pins 4 that accommodate connectors 12 on a test instrument. At the center of the annular card 1 is a flat annular needle holder 2 comprising an outer component 10 and an inner ring 11 with radiating contact needles 5.

Needle holder 2 is fastened to the card by rivets 8 and 9. Needles 5 have bent-down points 13 along the inside diameter of the device that can be brought into contact with the pads of an unillustrated integrated circuit. Needles 5 are fastened to needle holder 2 and connected to the printed circuits 3 on test card 1 by way of expanding and contracting sections 7.

The needle holder 2 is fastened to the card such that one rivet 8 establishes an inflexible connection between test card 1 and needle holder 2. The other rivets 9 rest in apertures 6 in test card 1 that have larger diameters than the rivets, allowing needle holder 2 to move in relation to the card and in its plane in their vicinity.

Test card 1 is connected to the instrument and lowered onto the circuit until an electric contact is established between needles 5 and the pads. If test card 1 expands during the subsequent test, it will displace in relation to needle holder 2 without noticeably changing position.

The test card 21 illustrated in FIG. 3 has a disk-shaped recess 214 at the center that tightly accommodates a needle holder 2 secured to the card with two rivets 8 and 9. Expanding and contracting sections 27 are adapted to the tight mounting of needle holder 2 and provided with a flexible range 215 of expansion.

Various modifications in structure and/or functions to the disclosed embodiments may be made by one skilled in the art without departing from the scope and extent of the invention as recited in the claims.

I claim:

1. A device for testing an integrated circuit comprising:

a test card having a given thermal expansion coefficient;

a holder means for holding a plurality of contact needles so as to make electrical contact with pads of the integrated circuit, the pads being disposed in a plane, wherein the holder means is supported by the test card and having a thermal expansion coefficient lower and different than the given thermal coefficient of the test card and a thermal expansion behavior which substantially matches that of the integrated circuit;

first connecting means disposed on the test card for establishing electrical contact between the test card and a test instrument;

second connecting means disposed between the test card and the holder means having expanding and contracting sections for establishing electrical contact between the test card and the holder means;

fastening means connecting the test card to the holder means for allowing the holder means to move independently in relation to the test card ensuring that temperature-dictated expansion of the test card is not impeded by the holder means to avoid warping of the test card and thereby retaining a geometry relation of the contact needles to one another and to the plane of the pads of the integrated circuit.

2. Device according to claim 1 wherein the contact needles are secured in the holder means.

3. Device according to claim 1 wherein the needle holder means expands or deforms minimally in the climatic range in which the integrated circuit is to be tested.

4. Device according to claim 1 wherein the needle holder means is inserted in a depression in the test card.

5. Device according to claims 1 or 3 wherein the test card and the needle holder means are disk-shaped.

6. Device according to claims 1 or 3 wherein the needle means comprises contacting needles connected to a printed circuit on the test card.

7. Device according to claim 6 wherein the needle holder means is inserted in a depression in the test card.

8. Device according to claim 6 wherein the needle means is connected to the printed circuit by expanding section means.

9. Device according to claim 1 wherein the needle holder means is rigidly fastened to the test card at one point by a fastener and attached to the test card by a further fastener such that the needle holder means can slide within the plane of the test card.

10. Device according to claim 5 wherein the needle holder means is rigidly fastened to the test card at one point by a fastener and attached to the test card by a further fastener such that the needle holder means can slide within the plane of the test card.

11. Device according to claim 6 wherein the needle holder means is rigidly fastened to the test card at one point by a fastener and attached to the test card by a further fastener such that the needle holder means can slide within the plane of the test card.

12. Device according to claim 6 wherein the needle means is connected to the printed circuit by an expanding section means.

13. Device according to claim 12 wherein the needle holder means is rigidly fastened to the test card at one point by a fastener and attached to the test card by a further fastener such that the needle holder means can slide within the plane of the test card.

14. Device according to claim 12 wherein the needle holder means is inserted in a depression in the test card.

15. Device according to claim 12 wherein the needle holder means is connected to the printed circuit by expanding section means.

16. Device according to claim 12 wherein the expanding section means extends from the needle holder means to the test card.

17. Device according to claim 16 wherein the needle holder means is inserted in a depression in the test card.

18. Device according to claim 12 wherein the needle holder means is connected to the printed circuit by expanding section means.

19. Device according to claims 1 or 3 wherein the needle holder means is replaceable.

20. Device according to claims 1 or 3 wherein the fastening means comprises first fastening means for rigidly fastening the needle holder means at one point to the test card and attached elsewhere to the test card by second fastening means, the second fastening means allowing the needle holder means to be displaced horizontally or vertically relative to the plane of the test card.

21. Device according to claim 20 wherein the test card has an aperture and the second fastening means comprises a fastener disposed in the aperture, the aperture being larger than the fastener.

22. Device according to claims 20 wherein the first and second fastening means are rivets.

23. Device according to claims 1 or 3 wherein the needle holder means is ceramic.

24. Device according to claims 1 or 3 wherein the needle holder means is inserted in a depression in the test card.

* * * * *